(12) United States Patent
Izadi et al.

(10) Patent No.: US 12,235,308 B2
(45) Date of Patent: Feb. 25, 2025

(54) POWER-LINE EVENT LOCATION SYSTEMS AND METHODS

(71) Applicant: Sentient Energy Technology, LLC, Wichita, KS (US)

(72) Inventors: Milad Izadi, Riverside, CA (US); Mirrasoul J. Mousavi, San Jose, CA (US); Jong Min Lim, Mountain View, CA (US)

(73) Assignee: SENTIENT TECHNOLOGY HOLDINGS, LLC, Wichita, KS (US)

( * ) Notice: Subject to any disclaimer, the term of this patent is extended or adjusted under 35 U.S.C. 154(b) by 209 days.

(21) Appl. No.: 17/984,245

(22) Filed: Nov. 10, 2022

(65) Prior Publication Data

US 2023/0145022 A1    May 11, 2023

Related U.S. Application Data

(60) Provisional application No. 63/278,005, filed on Nov. 10, 2021, provisional application No. 63/285,411, filed on Dec. 2, 2021.

(51) Int. Cl.
*G01R 31/08* (2020.01)
*H02J 3/00* (2006.01)

(52) U.S. Cl.
CPC .......... *G01R 31/085* (2013.01); *H02J 3/0012* (2020.01)

(58) Field of Classification Search
CPC .................................................. G01R 31/085
See application file for complete search history.

(56) References Cited

U.S. PATENT DOCUMENTS

2018/0316186 A1* 11/2018 Klocman .......... H02J 13/00002

OTHER PUBLICATIONS

Farajollahi et al "Locating the Source of Events in Power Distribution Systems Using Micro-PMU Data" IEEE Transactions on Power Systems, vol. 33, Issue6, pp. 6343-6354, (Year: 2018).*
Bastos et al., "SynchroWaveform Measurement Units and Applications", IEEE Power & Energy Society General Meeting (PESGM), 05 Pages, 2019.
Borghetti et al., "Integrated Use of Time-Frequency Wavelet Decompositions for Fault Location in Distribution Networks: Theory and Experimental Validation", IEEE Transactions on Power Delivery, vol. 25, Issue 4, pp. 3139-3146, Oct. 2010.
Chen et al., "Contactless Voltage Distortion Measurement Using Electric Field Sensors", IEEE Transactions on Smart Grid, vol. 9, Issue 6,pp. 5643-5652, Nov. 2018.

(Continued)

*Primary Examiner* — Alesa Allgood
(74) *Attorney, Agent, or Firm* — Perilla Knox & Hildebrandt LLP; Thomas B. Hildebrandt

(57) ABSTRACT

Disclosed are various embodiments for unsupervised power-line event location within a power-line network. In one embodiment, e-field measurements are received from a plurality of line-mounted sensors located on one or more power lines in the power-line network. The e-field measurements to voltage approximations. A feeder model of the power line network is constructed based at least in part on the voltage approximations. An event within the power-line network is identified. A location of the event is identified based at least in part on the feeder model.

20 Claims, 7 Drawing Sheets

(56) References Cited

OTHER PUBLICATIONS

Farajollahi et al., "Locating the Source of Events in Power Distribution Systems Using Micro-PMU Data", IEEE Transactions on Power Systems, vol. 33, Issue 6, pp. 6343-6354, Nov. 2018.

Izadi et al., "A Synchronized Lissajous-based Approach to Achieve Situational Awareness Using Synchronized Waveform Measurements", 2021 IEEE Power Energy Society General Meeting (PESGM), pp. 1-5, Jul. 2021.

Izadi et al.,"Characterizing Synchronized Lissajous Curves to Scrutinize Power Distribution Synchro-Waveform Measurements", IEEE Transactions on Power Systems vol. 36, Issue 5, pp. 4880-4883, Sep. 2021.

Izadi et al., "Event Location Identification in Distribution Networks Using Waveform Measurement Units", IEEE PES Innovative Smart Grid Technologies Europe (ISGT—Europe), pp. 924-928, Oct. 2020.

Izadi et al., "Synchronous Waveform Measurements to Locate Transient Events and Incipient Faults in Power Distribution Networks", IEEE Transactions on Smart Grid, vol. 12, Issue 5,pp. 4295-4307, Sep. 2021.

Krishnathevar et al.,"Generalized Impedance-Based Fault Location for Distribution Systems", IEEE Transactions on Power Delivery, vol. 27, Issue 1, pp. 449-451, Jan. 2012.

Kulkarni et al., "Incipient Fault Location Algorithm for Underground Cables", IEEE Transactions on Smart Grid, vol. 5, Issue 3, pp. 1165-1174, May 2014.

Zhang et al., "Using Deep Learning to Identify Utility Poles with Crossarms and Estimate Their Locations from Google Street View Images", vol. 18, 21 Pages, 2018.

\* cited by examiner

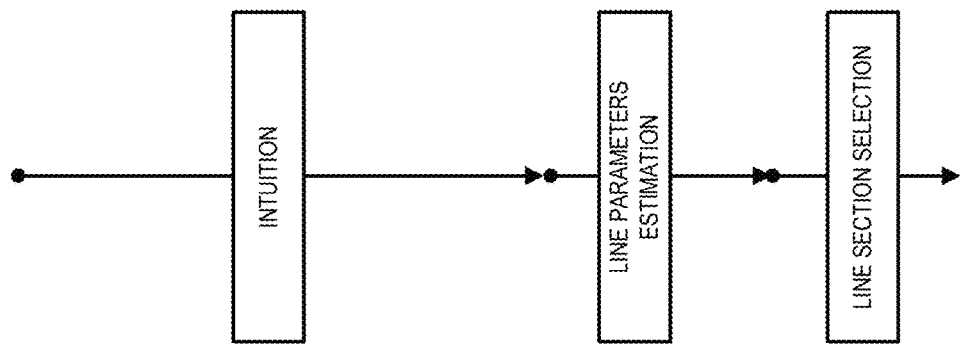
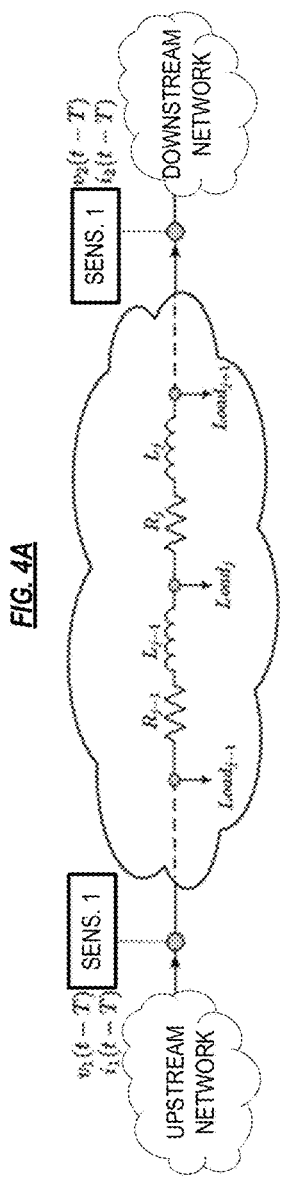
FIG. 4A
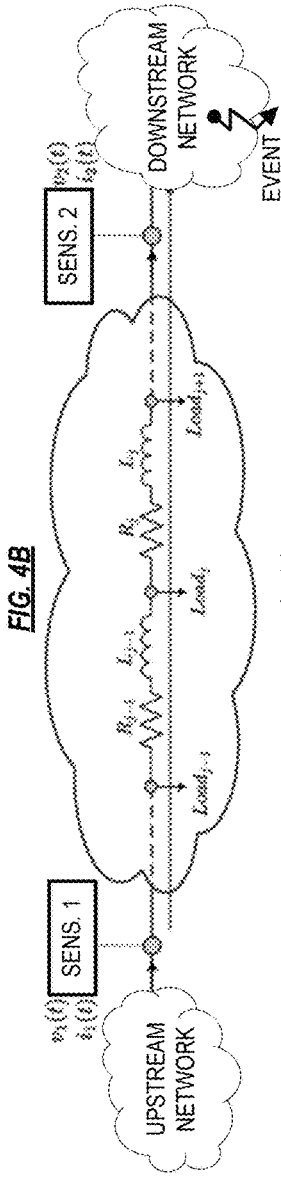
FIG. 4B
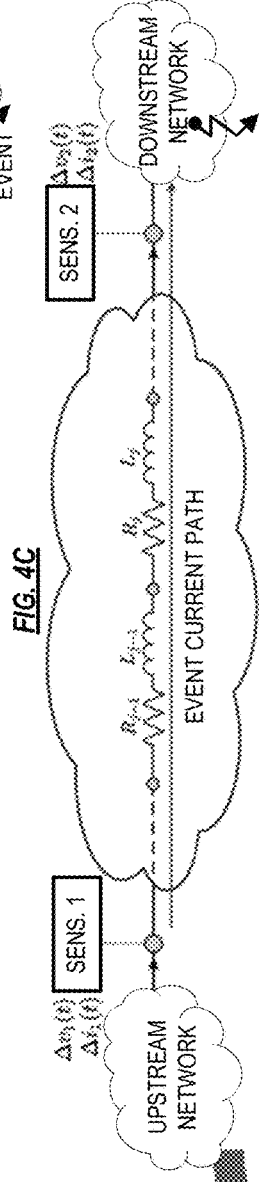
FIG. 4C
FIG. 4D
FIG. 4E

POWER-LINE EVENT LOCATION SYSTEMS AND METHODS

CROSS-REFERENCE TO RELATED APPLICATIONS

This application claims the benefit of, and priority to, U.S. Provisional Application No. 63/278,005, entitled "POWER-LINE EVENT LOCATION SYSTEMS AND METHODS, and filed on Nov. 10, 2021. This application also claims the benefit of, and priority to, U.S. Provisional Application No. 63/285,411, entitled "POWER-LINE EVENT LOCATION SYSTEMS AND METHODS, and filed on Dec. 2, 2021. The above applications are incorporated herein by reference in their entireties.

BACKGROUND

Power-line event location identification is a challenging task in power distribution feeders due to limited number of measurement devices in practice. Moreover, the network parameters are usually not available in practice, which adds more challenges to the event location identification task.

SUMMARY

This document proposes an unsupervised approach to address both challenges. In this regard, the systems and methods disclosed herein identify the location of events in distribution feeders using synchro-waveform measurements from a group of line-mounted sensors, which are relatively inexpensive and very easy to install. Importantly, the systems and methods disclosed herein do not require any prior knowledge about the network parameters, namely the parameters of the distribution lines and the loading at the nodes. The systems and methods disclosed herein utilize line-mounted sensors that measure GPS-synchronized waveforms for electric field and current waveforms measurements in time-domain.

The unsupervised method and systems implementing said unsupervised method, comprise at least three steps. First, the voltage waveform is approximated from the available electric field waveform measurement from the line-mounted sensors. Next, the network parameters are estimated using a novel event-based method that takes advantages of a few number of synchro-waveform measurements. Also, the number of line segments of the network are estimated based at least in part on the number of poles in the measured network. These parameters are then used to reconstruct a network model for power-line event location identification. Finally, the location of the power-line event is identified by analyzing a data-driven reconstructed feeder model and using the synchro-waveform measurements of current and approximated voltage.

Further disclosed herein is an example of the systems and methods applied to real-world field measurements from a distribution feeder. The results demonstrate the accuracy and consistency of the disclosed systems and methods in identifying the location of the events.

Importantly, unlike the existing methods, the systems and methods disclosed herein do not require any knowledge about the network parameters; instead requiring only waveform data from a few number of inexpensive and easy-to-install sensors (such as, but not limited to e-field sensors capable of edge analytics in the sensor).

In the literature, different methods have been proposed to identify the location of events in power systems, including impedance-based methods, e.g., see S. Kulkarni, S. Santoso, and T. A. Short, "Incipient fault location algorithm for underground cables," IEEE Trans. Smart Grid, vol. 5, no. 3, pp. 1165-1174, May 2014; R. Krishnathevar and E. E. Ngu, "Generalized impedance-based fault location for distribution systems," IEEE Trans. Power Deli., vol. 27, no. 1, pp. 449-451, January 2012, traveling wave-based methods, e.g., see A. Borghetti, M. Bosetti, C. A. Nucci, M. Paolone, and A. Abur, "Integrated use of time-frequency wavelet decompositions for fault location in distribution networks: theory and experimental validation," IEEE Trans. Power Deli., vol. 25, no. 4, pp. 3139-3146, October 2010, and wide area-based methods, e.g., see M. Izadi and H. Mohsenian-Rad, "Synchronous waveform measurements to locate transient events and incipient faults in power distribution networks," IEEE Trans. Smart Grid, vol. 12, no. 5, pp. 4295-4307, September 2021; M. Izadi and H. Mohsenian-Rad, "Event location identification in distribution networks using waveform measurement units," in Proc. IEEE PES ISGT Europe, The Hague, Netherlands, 2020, pp. 924-928; M. Farajollahi, A. Shahsavari, E. Stewart, and H. Mohsenian-Rad, "Locating the source of events in power distribution systems using micro-PMU data," IEEE Trans. Power Syst., vol. 33, no. 6, pp. 6343-6354, November 2018. Of our particular interest is the work in M. Izadi and H. Mohsenian-Rad, "Synchronous waveform measurements to locate transient events and incipient faults in power distribution networks," IEEE Trans. Smart Grid, vol. 12, no. 5, pp. 4295-4307. September 2021, which uses synchronized waveform measurements from waveform measurement units (WMUs), see e.g., A. F. Bastos, S. Santoso, W. Freitas, and W. Xu, "Synchrowaveform measurement units and applications," in Proc. IEEE PES General Meeting, Atlanta, GA, USA, 2019, pp. 1-5; M. Izadi and H. Mohsenian-Rad, "Characterizing synchronized lissajous curves to scrutinize power distribution synchro-waveform measurements," IEEE Trans. Power Syst., pp. 1-4, May 2021; M. Izadi and H. Mohsenian-Rad, "A synchronized Lissajous-based approach to achieve situational awareness using synchronized waveform measurements," in Proc. IEEE PES General Meeting, Washington, DC, 2021, pp. 1-5. The method in the Izadi Paper is able to identify the correct location of a wide range of events in power distribution networks, including transient events, such as incipient faults, and permanent events, such as permanent faults and capacitor bank switching events. Although this method performs very well, it requires information about the network parameters, namely the impedance of the distribution lines and the loading of the nodes. However, such network information is not always available. Also, the method in "Synchronous waveform measurements to locate transient events and incipient faults in power distribution networks," by M. Izadi and H. Mohsenian-Rad, in IEEE Trans. Smart Grid, vol. 12, no. 5, pp. 4295-4307, September 2021, requires access to the synchronized voltage waveform measurements. However, in practice, the line-mounted sensors cannot measure voltage waveforms reliably without a ground reference or special provisions, instead they measure e-field waveforms.

BRIEF DESCRIPTION OF THE FIGURES

The foregoing and other features and advantages of the disclosure will be apparent from the more particular description of the embodiments, as illustrated in the accompanying drawings, in which like reference characters refer to the same parts throughout the different figures. The drawings are not necessarily to scale, emphasis instead being placed upon illustrating the principles of the disclosure.

FIGS. 4A-E show an example network power distribution feeder (which is an example of feeder network 104) that is observed by two line sensors.

DETAILED DESCRIPTION OF THE EMBODIMENTS

Figure 1:
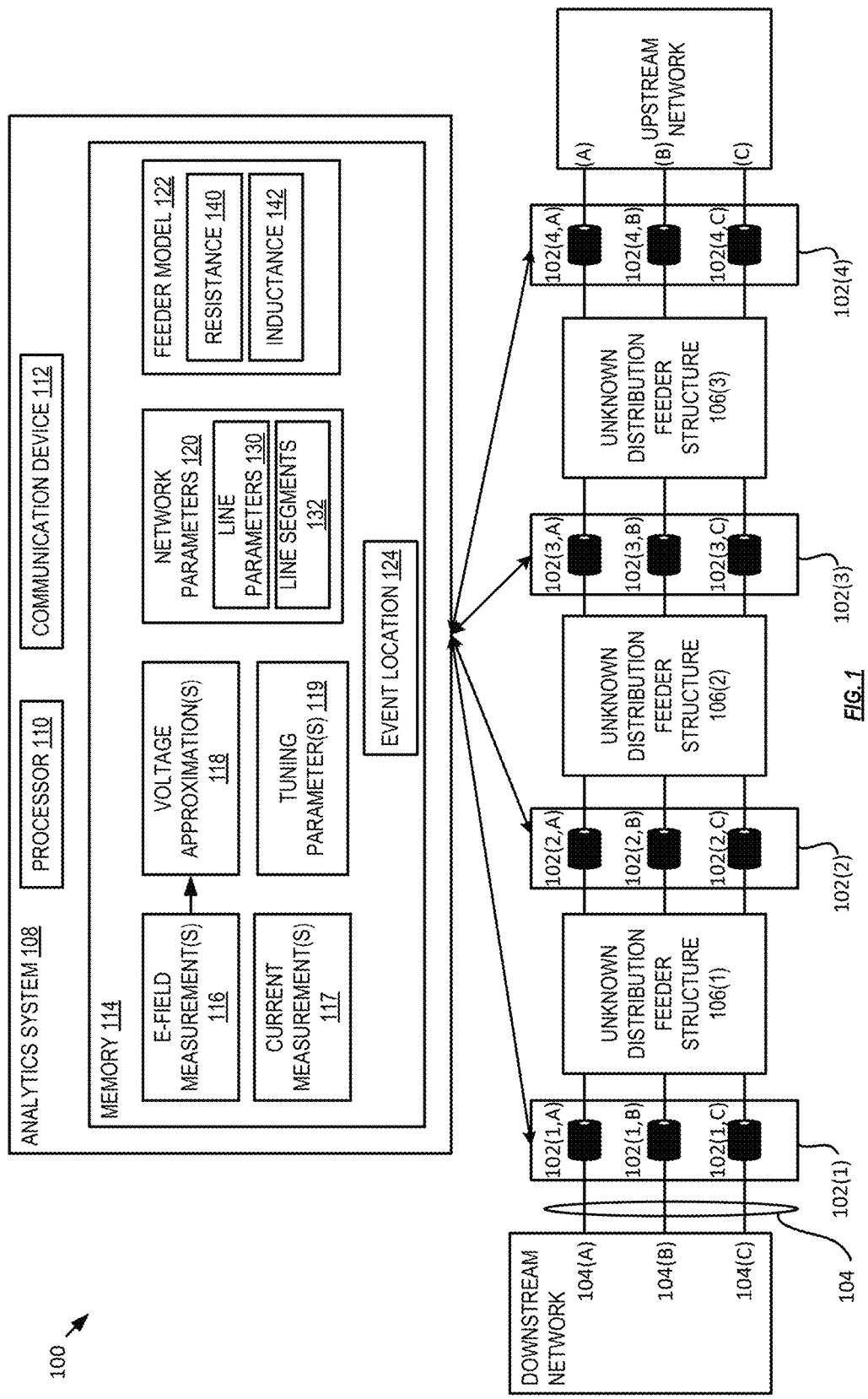
FIG. 1 illustrates a system provided with the e-field and current waveform measurements from line-mounted sensors, in embodiments.

FIG. 1 illustrates a system 100 provided with the e-field and current waveform measurements from line-mounted sensors 102, such as the MM3 intelligent grid sensor manufactured by Sentient Energy, at a three-phase power distribution feeder 104. The system 100 may not have any prior knowledge about the structure and parameters of this feeder 104. The line-mounted sensors 102 are placed at four sites and each site has three sensors, thus, in total, there are 3×4=12 sensors on the feeder. When an event occurs, the line-mounted sensors can capture precise time-stamp-synchronized electric field (e-field) and current waveforms on one phase. For example, the precise time-stamping (e.g., for precision time synchronization) may be based at least in part on one or more of Global Navigation Satellite System (GNSS) signals such as Global Positioning System (GPS) signals, Institute of Electrical and Electronics Engineers (IEEE) 1588 for Local Area Network (LAN) wired devices, and other such precise time sources. Each line-mounted sensor can report 130 recordings per cycle, i.e., one sample every 120 pec. The locations of the sensors are known from their latitude and longitude coordinates. The aforementioned 12 sensors are named based at least in part on their sites and their phases as follows: 102(1,A),102(1,B),102(1,C), . . . , 102(4,A),102(4,B),102(4,C). For simplicity, this document refer to Sensor 102(1) as the three line-mounted sensors 102(1,A), 102(1,B), and 102(1,C) at Site 1, Sensor 102(2) as the sensors 102(2,A), 102(2,B), and 102(2,C) at Site 2, and so on. The locations of sensors are as follows: Sensor 102(1) is at the upstream of Sensor 102(2), Sensor 102(2) is at the upstream of Sensor 102(3), and Sensor 102(3) is at the upstream of Sensor 102(4).

Figure 2:
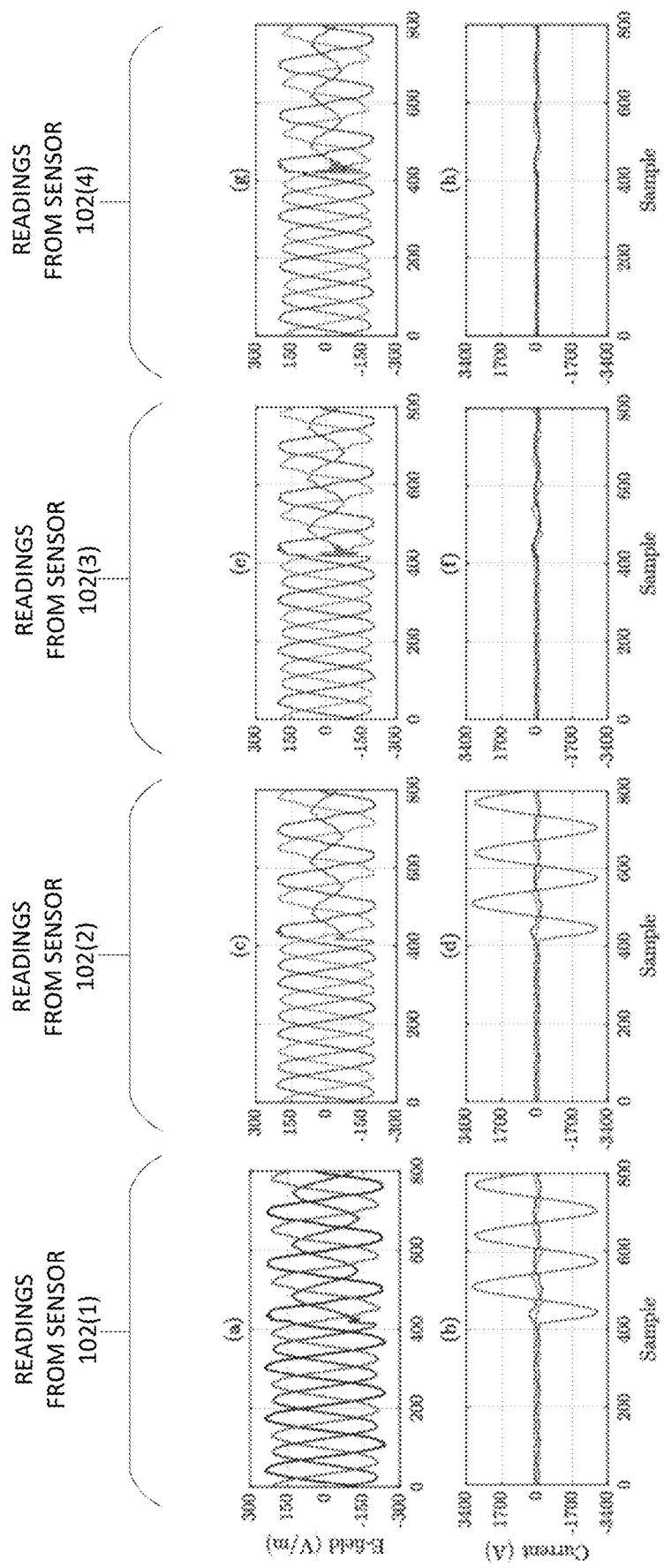
FIG. 2 shows an example of real-world synchronized e-field waveform and current waveform measurements that are captured by the sensors 102 during an event on the feeder 104.

FIG. 2 shows an example of real-world synchronized e-field waveform and current waveform measurements that are captured by the sensors 102 during an event on the feeder 104. As shown, the event has occurred somewhere on Phase B between Sensor 102(2) and Sensor 102(3). The reason for this argument is that, the event causes very large changes in Phase B of the current waveform of Sensor 102(2), while it causes very small changes in Phase B of the current waveform of Sensor 102(3). The systems and methods discussed herein provide the unique capability to only use these synchronized waveform measurements, without any prior information about the network 104, and identify more precise location of the event.

Since the voltage waveforms and the network parameters are not available in system 100, because the sensor 102 take e-field measurements and not direct voltage measurements, system 100 implements a different approach to identify the location of events by using the synchronized e-field and current waveform measurements. In this regard, system 100 includes an analytics system 108 that implements an unsupervised event location identification method. Analytics system 108 is shown in FIG. 1 as a separate system from the sensors 102. Accordingly, the analytics system 108 may be a separate cloud-based network server, or a component of the feeder system 104, such as a component of the SCADA associated with the feeder 104. It should be appreciated, however, that the analytics system 108 may be integral with one or more of the sensors 102, in either a distributed analytics configuration, or on a single one of the sensors 102 in a master-slave configuration. Accordingly, analytics system 108 may include a processor 110, communications device 112, and memory 114 storing the necessary computer-readable instructions that, when executed by the processor 110, implement the functionality of the analytics system 108 discussed herein.

The processor 110 may be any type of circuit capable of performing logic, control, and input/output operations. For example, the processor 110 may include one or more of a microprocessor with one or more central processing unit (CPU) cores, a graphics processing unit (GPU), a digital signal processor (DSP), a field-programmable gate array (FPGA), a system-on-chip (SoC), and a microcontroller unit (MCU). The processor 110 may also include a memory controller, bus controller, one or more co-processors, and/or other components that manage data flow between the processor 110 and other components communicably coupled to the system bus. The processor 110 may be implemented as a single integrated circuit (IC), or as a plurality of ICs. In some embodiments, one or more of the processor 110 and memory 114 are implemented as a single IC. The processor 110 may use a complex instruction set computing (CISC) architecture, or a reduced instruction set computing (RISC) architecture.

Memory 114 may be any type of data storage device, including but not limited to non-volatile memory, such as flash memory, NVRAM, FRAM, MRAM, EEPROM, EPROM, or any combination thereof, and volatile memory, such as DRAM, SRAM, or a combination thereof.

Figure 3:
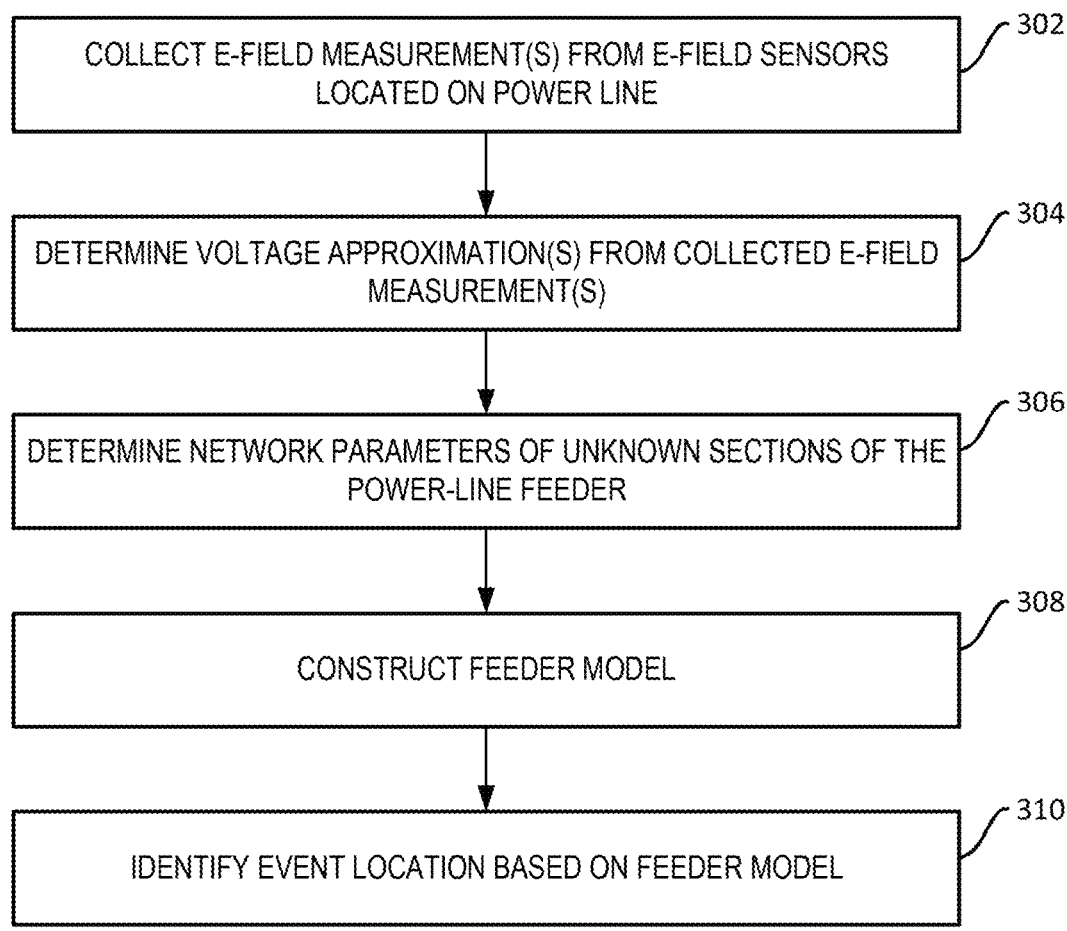
FIG. 3 depicts a method 300 for unsupervised power-line event location systems and methods, in an embodiment.

FIG. 3 depicts a method 300 for unsupervised power-line event location systems and methods, in an embodiment. Method 300 is implemented via analytics system 108, for example.

In block 302, the method 300 collects e-field measurement(s) and current measurements from GPS synchronized sensors located on the power line. In one example of block 302, sensors 102 collect e-field and current measurements on one or more of phases (A), (B), and (C) of power line feeder 104. The collected e-field measurements may be transmitted to and received by analytics system 108 for storage in the memory 114 thereof as collected e-field measurement(s) 116. The collected current measurements may be transmitted to and received by analytics system 108 for storage in the memory 114 thereof as collected current measurement(s) 117. The e-field measurements 116 and current measurements 117 may be time-series measurements representable as a respective e-field and current waveform.

In block 304 the voltage waveforms are approximated from the available e-field and current waveform measurements from sensors 102. This is done based at least in part on the linear relationship between voltage and e-field in the line-mounted sensors 102. In one example of block 304, the analytics system 108 determines voltage approximation(s) 118.

In block 306, the line parameters of unknown sections of the feeder 104 (e.g., unknown sections 106(1)-(3) in FIG. 1) are estimated using an unsupervised event-based method based at least in part on the approximated voltage waveforms. In one example of block 306, the analytics system 108 determines network parameters 120 of unknown sections 106.

In block 308, the feeder model is constructed using the estimated line parameters and the location of the sensors on the utility poles. In one example of block 308, the analytics system 108 constructs a feeder model 122 using line parameters 130 and the number of line segments 132 (e.g., number of poles/nodes between two of the sensors 102).

In block 310, the analytics system 108 uses the method in M. Izadi and H. Mohsenian-Rad, "Synchronous waveform measurements to locate transient events and incipient faults in power distribution networks," IEEE Trans. Smart Grid, vol. 12, no. 5, pp. 4295-4307, September 2021 to identify the location of the event based at least in part on analyzing the data-driven reconstructed feeder model. This paper is incorporated herein by reference, and referred to as the "Izadi Paper" hereinafter.

The proposed method is purely data-driven and model-free. It is unsupervised because it requires only the data (e.g., synchronized e-field measurement(s) 116 and current measurement(s) 117) from a group of sensors (e.g., sensors 102); without requiring any prior knowledge about the feeder network 104. Accordingly, the proposed method is very suitable for real-world field implementation, as it is evident from the results that presented herein based on real-world field measurements.

Voltage Waveform Approximation Based on Electric Field Waveform Measurements

As mentioned above, the line-mounted sensors 102 measure GPS-synchronized e-field waveform and current waveform measurements in time-domain whenever an event occurs. The line-mounted sensors 102 cannot measure voltage waveforms, instead they measure e-field waveforms (e.g., represented from the e-field measurements 116). Even though voltage waveform is not measured directly, since line-mounted sensors 102 are installed very close to the line conductor, they can provide a good approximation of the shape of the voltage waveform. In particular, the e-field waveform measurements is almost in-phase with the voltage waveform of the conductor. Thus, even though voltage waveform is not measured directly by the line sensors, they provide a good approximation of the voltage waveform based at least in part on the e-field waveform measurements. Therefore, in one embodiment of block 304, and to generate the voltage approximation(s) 118, analytics system 108 assumes that the voltage waveform is a multiple of the e-field waveform measurements.

Let e(t) denote the e-field waveform (e.g., collective e-field measurement(s) 116 spanning a given period) that is directly measured by a line-mounted sensor 102 around a line conductor; and let v(t) denote the voltage waveform of the conductor. Under the practical assumption mentioned in the previous paragraph, the voltage waveform can be approximated based at least in part on the e-field waveform measurements by using a multiplier as follows:

$$v(t)=\beta \times e(t), \quad \text{Equation (1)}$$

where $\beta \geq 0$ denotes the multiplier. The multiplier $\beta$ may be referred to as tuning parameter 119, shown in FIG. 1, and a respective tuning parameter $\beta_{sensor}$ may be calculated for each sensor 102. The analytics system 108 can analytically obtain $\beta$ based at least in part on different environmental factors, including the distance between the conductor and the e-field measuring point, the geometry of the conductor, and the dielectric permittivity of free space. Additional details on how to approximate voltage from e-field measurements include the concepts discussed in K. Chen, X. Yang, and W. Xu. "Contactless voltage distortion measurement using electric field sensors," IEEE Trans. Smart Grid, vol. 9, no. 6, pp. 5643-5652, November 2018, which is incorporated herein by reference.

A practical option is to obtain $\beta$ based at least in part on the available data from the line sensors 102. Under normal operating conditions, i.e., in the absence of an event or a disturbance, the voltage at any point on a conductor is very close to the voltage at the substation, where the voltage is measured directly as part of the typical substation monitoring system via SCADA. Hence, it can be assumed that the peak amplitude of voltage waveform during the normal operating condition is available from the voltage level of the feeder 104 at the nearest substation. Therefore, analytics system 108 may obtain $\beta$ based at least in part on the peak amplitude of the e-field waveform and the peak amplitude of the voltage waveform during normal conditions and a configurable amount of time (e.g., in cycles, such as but not limited to 10 cycles (or more or fewer cycles)) before an event or a disturbance occurs.

For example, consider the real-world e-field waveform measurements in FIG. 2. It is shown that, the peak amplitude of the e-field waveform measurements on Phase B of Sensor 102(1) during the normal operating conditions, i.e., right before the event occurs at sample 400, is about 210 V/m. On the other hand, the feeder 104 is operated at 22.9 kV line-to-line. Therefore, the peak amplitude of the voltage waveform during normal conditions is obtained as $22.9 \times 1000 \times \sqrt{2}/\sqrt{3}=18{,}698$ V. Given the peak amplitudes of the e-field and voltage waveforms, the tuning operator can be given as $\beta=18{,}698/210=89$.

Once the multiplier is obtained, the voltage waveform can be approximated via Equation (1), above. Similarly, analytics system 108 may determine the tuning parameter 119 for other sensors 102 on all three phases. Generation of the voltage approximation(s) 118 then includes multiplying the e-field measurement(s) 116 by the respective tuning parameter 119 according to Equation (1).

Based on the above approximation, for the rest of this document, we assume that we have access to the current waveform measurements and the approximated voltage waveform measurements at each of the line-mounted sensors 102.

Data-Drive Reconstruction of an Unknown Feeder Model

As discussed above, in block 308, method 300 and analytics system 108 implementing method 300, constructs a feeder model 122. This resolves the problem where the system does not have prior information about the network parameters of network 104, namely the impedance of the distribution lines and the loading of the nodes. Thus, in block 308, those parameters are determined (estimated)

based at least in part on the measurements from the line-mounted sensors 102 and eventually reconstruct a feeder model 122.

Block 308 may operate according to an intuition which helps simplify the distribution feeder between two sensors 102 during the event (e.g., in one or more of unknown network sections 106(1)-(3) in FIG. 1). Using this intuition, unsupervised event-based method 300 may estimate line parameters. Block 308 may select the number of line segments 132 based at least in part on the utility poles in the field to reconstruct a data-driven feeder model. This reconstructed feeder model will be later used for event location identification (e.g., in block 310).

Intuition for Feeder Model Construction:

FIGS. 4A-E show an example network power distribution feeder (which is an example of feeder network 104) that is observed by two line sensors (which may be similar to the line sensors 102 discussed above), where Sensor 1 is installed near the upstream network and Sensor 2 is installed near the downstream network. Let $i_1(t)$ denote the current waveform measurements and $v_1(t)$ denote the approximated voltage waveform measurements obtained from Sensor 1. Also, let $i_2(t)$ denote the current waveform measurements and $v_2(t)$ denote the approximated voltage waveform measurements that are obtained from Sensor 2. Notice that, $v_1(t)$ and $v_2(t)$ are, respectively, approximated based at least in part on $e_1(t)$ and $e_2(t)$ using the relationship in Equation (1), discussed above.

Suppose an event occurs at time $\tau$ at an unknown location. For the sake of explanation, assume that the event has occurred somewhere at the downstream of the two sensors, i.e., the event zone is in the area that is marked as in the downstream network. This assumption helps us simplify the distribution feeder between Sensor 1 and Sensor 2, as next explained.

A simple option to determine the aforementioned region of the event is to compare the current waveform right before the event occurs with the current waveform right after the event occurs. If the changes in the current waveform that are seen by a sensor are considerable, then the event has occurred at the downstream of the sensor; otherwise it has occurred at the upstream of the sensor.

The event may be identified based at least in part on unexpected threshold differences between current waveforms at a current sensor as compared to upstream sensors. For example, again consider the real-world synchronized waveform measurements in FIG. 2. The event has occurred at the downstream of Sensor 102(1) and Sensor 102(2), because the event causes very large changes in the current waveform at these two sensors, but it causes very small changes in the current waveform at Sensor 102(3) and Sensor 102(4).

The following discussion illustrates how the analytics system 108 may obtain the network parameters 120, such as in block 306. For sake of discussion, the analytics system 108 may first analyze the distribution feeder at one cycle, right before the event occurs, i.e., from time $\tau-T$ to time $\tau$, where $\tau$ is the time that the event has occurred and T=16.6667 msec is the duration of one cycle. FIGS. 4A-E show the distribution feeder for the period of $\tau-T$ to $\tau$. During this period, the distribution feeder is under normal operating conditions, i.e., there is no event. Once the event occurs at time $\tau$, the event current is injected to the network, as shown in FIG. 4B. Given the waveforms right before the event occurs, i.e., from $\tau-T$ to $\tau$, and the waveforms right after the event occurs, i.e., from $\tau$ to $\tau+T$, the analytics system 108 can obtain the amount of changes in voltage waveforms and current waveforms at Sensors 1 and 2 as follows:

$$\Delta v_1(t) = v_1(t) - v_1(t-T), t = \tau, \ldots, \tau+T,$$

$$\Delta v_2(t) = v_2(t) - v_2(t-T), t = \tau, \ldots, \tau+T,$$

$$\Delta i_1(t) = i_1(t) - i_1(t-T), t = \tau, \ldots, \tau+T,$$

$$\Delta i_2(t) = i_2(t) - i_2(t-T), t = \tau, \ldots, \tau+T. \quad \text{Equation (2)}$$

where $\Delta v_1(.)$ and $\Delta v_2(.)$ denote the changes in the voltage waveforms at Sensor 1 and Sensor 2, respectively, due to the event; $\Delta i_1(.)$ and $\Delta v_2(.)$ denote the changes in the current waveforms at Sensor 1 and Sensor 2, respectively, due to the event. By comparing the distribution feeder right before the event occurs, as in FIG. 4A, and the distribution feeder right after the event occurs, as in FIG. 4B, it is expected that the network parameters including the line parameters and load parameters remain the same. The reason comes from the fact that, once the event occurs, the most portion of the event current is injected into the upstream network, because the Thevenin impedance of the upstream network is smaller than the impedance of the load points. In other words, almost all of event current flows from the event location to the upstream network, as shown with the red line in FIG. 4C. Accordingly, the currents of the line segments between Sensor 1 and Sensor 2 are the same. Thus, the changes in current waveforms of Sensor 1 and Sensor 2 are almost the same, thus the following applies:

$$\Delta i_1(t) \approx \Delta i_2(t), t = \tau, \ldots, \tau+T. \quad \text{Equation (3)}$$

From Equation 3, the analytics system 108 can simplify the distribution feeder between Sensor 1 and Sensor 2 during the event. That is, the analytics system 108 can assume that there is no load points between the two sensors during the event, as shown in FIG. 4C.

Using Regression to Estimate Line Parameters:

According to the intuition explained above, the analysis can be focused during the event on the simplified distribution feeder model in FIG. 4C. In this simplified model, the nodal voltages are the changes in the voltage waveforms between the two successive cycles, one cycle right after the event and one cycle right before the event, as in Equation (2). Similarly, the line currents are the changes in current waveforms between the two successive cycles, one cycle right after the event and one cycle right before the event, as in Equation (2). As a result, the line parameters 130 of the segments between Sensor 1 and Sensor 2 are connected in series, see FIG. 4C. In this regard, let $R_j$ and $L_j$ denote the resistance and the inductance of the line segment $j$, respectively. Considering the series connection of the line parameters 130 between Sensor 1 and Sensor 2, the voltage difference in time-domain between the two sensors can be written as follows:

$$\Delta v_1(t) - \Delta v_2(t) = \sum_{j \in S} R_j \Delta i_1(t) + \sum_{j \in S} L_j \frac{d\Delta i_1(t)}{dt}, \quad \text{Equation (4)}$$

$$= R\Delta i_1(t) + L\frac{d\Delta i_1(t)}{dt},$$

$$t = \tau, \ldots, \tau+T,$$

where $S$ denotes the set of all the line segments between Sensor 1 and Sensor 2; R denotes the combined resistance that is obtained by adding up all the line resistances between Sensors 1 and 2; and L denotes the combined inductance that is obtained by adding up all the line inductances between Sensors 1 and 2. FIG. 4D shows the distribution feeder with the combined line parameters R and L. Equation (4) can be written in matrix form as follows:

$$\Delta V = \Delta I P, \quad \text{Equation (5)}$$

where $$\Delta V = \begin{bmatrix} \Delta v_1(\tau) - \Delta v_2(\tau) \\ \Delta v_1(\tau + \Delta t) - \Delta v_2(\tau + \Delta t) \\ \vdots \\ \Delta v_1(\tau + T) - \Delta v_2(\tau + T) \end{bmatrix}, \quad \text{Equation (6)}$$

$$\Delta I = \begin{bmatrix} \Delta i_1(\tau) & \dfrac{d\Delta i_1(\tau)}{dt} \\ \Delta i_1(\tau + \Delta t) & \dfrac{d\Delta i_1(\tau + \Delta t)}{dt} \\ \vdots & \vdots \\ \Delta i_1(\tau + T) & \dfrac{d\Delta i_1(\tau + T)}{dt} \end{bmatrix}, P = \begin{bmatrix} R \\ L \end{bmatrix}, \quad \text{Equation (7)}$$

where $\Delta t = 120$ μsec is the reporting interval of the sensors.

We can estimate the line parameters 130 in Equation (5) by using the regression method with the following close-form solution:

$$\hat{P} = \underset{P}{\operatorname{argmin}} \|\Delta V - \Delta I P\|_2 \quad \text{Equation (8)}$$

$$= (\Delta I^T \Delta I)^{-1} \Delta I^T \Delta V,$$

where $\|\cdot\|_2$ denotes norm-2; $(\cdot)^T$ and $(\cdot)^{-1}$ denote the operators to take the transpose and the inverse of a matrix, respectively; and $\hat{P}$ denotes the estimation of the unknown line parameters 130.

Selecting the Number of Line Segments

Given the estimated line parameters 130 between two sensors during the event, the next step is to determine the number of line segments 132 between the two sensors. It should be mentioned that, the structure of the distribution feeder between the two sensors is not available. Thus, the analytics system 108 may need to reconstruct the feeder model, as explained next.

In practice, utility poles are used to carry overhead lines. For the sake of our analysis, the analytics system 108 may treat each pole as a node for a distribution feeder. Even in the absence of the utility model, the location of the utility poles can be detected by using aerial images, Google street view images, or field surveys (see, e.g., W. Zhang, C. Witharana, W. Li, C. Zhang, X. Li, and J. Parent, "Using deep learning to identify utility poles with crossarms and estimate their locations from google street view images," Sensors, vol. 18, no. 8, August 2018). Even if the location of the poles is not known, the analytics system 108 can use the fact that the distance between every two adjacent utility poles are usually equal. Thus, another option to obtain the number of poles is to use the distance between two sensors and the typical distance between two adjacent poles. Suppose the distance between two sensors is D and the distance between two adjacent poles is h. The number of poles 132 between the two sensors is obtained as:

$$n = [D/h] + 1, \quad \text{Equation (9)}$$

where [.] returns the integer part. For example, the distance between Sensor 1 and Sensor 2 in FIG. 4 is 12,670 ft and the average distance between two adjacent poles of the under-study feeder is 150 ft. Thus, the number of poles/nodes between Sensor 1 and Sensor 2 is n=85=[12,670/150]+1.

Next, the nodes from node 1 are enumerated, where Sensor 1 is installed, to node n, where Sensor 2 is installed, as shown in FIG. 4E. Thus, the number of line segments between the two sensors is n×1. Next, the estimated combined line parameters P from Equation (8) and number of line segments n from Equation (9) are used to obtain the resistance 140 of each line segment as R/(n−1) and the inductance 142 of each line segment as L/(n−1), as shown in FIG. 4E. The above process may be repeated for any number of unknown segments (e.g., segments 106) as necessary to determine network parameters 120 throughout feeder 104.

The network model in FIG. 4E is the complete reconstruction of the model (e.g., feeder model 122) for the power distribution feeder. Importantly, this data-driven reconstructed model does not require any prior information about the network structure and its parameters. This data-driven model is all the analytics system 108 needs for event location identification.

In embodiments where multiple sensors are available on a distribution feeder, the analytics system 108 reconstructs the feeder model between every two adjacent sensors. For example, to reconstruct the network model 122 for the distribution feeder 104 in FIG. 1 the analytics system 108 repeats the above analysis for any two adjacent sensors. The analytics system 108 first reconstructs the part of the network for unknown distribution feeder structure 106(1) that is between Sensor 102(1) and Sensor 102(2). Next, the analytics system 108 reconstructs the part of the network for unknown distribution feeder structure 106(2) that is between Sensor 102(2) and Sensor 102(3). Finally, the analytics system 108 reconstructs the part of the network for unknown distribution feeder structure 106(3) that is between Sensor 102(3) and Sensor 102(4).

Event Location Identification:

Once the network model is fully reconstructed as discussed above in block 308, analytics system 108 implements block 310 to identify the event location based at least in part on the feeder model. Block 310 can now use the method in the Izadi Paper to complete the task of event location identification. One embodiment of implementation of block 310 is as follows.

First, the oscillatory modes of the transient components of synchronized waveforms are characterized by conducting a modal analysis. Second, a circuit model for the underlying distribution feeder is obtained at the identified dominant mode(s) of the transient event. It should be noted that, the analytics system 108 may use the reconstructed feeder model, as explained above, to obtain the feeder model at the dominant mode. Finally, the location of the transient event is identified by analyzing the obtained circuit model. For the rest of this section, assume that the synchronized waveform measurements are already characterized by using a modal analysis, as in Section II of the Izadi paper, which is incorporated by reference here; and the circuit model is already obtained, as in Section III of the Izadi paper.

Consider the data-driven reconstructed distribution feeder in FIG. 4E that consists of n nodes and n−1 line segments. The resistances of the line segments are denoted by $R_1$, $R_2$, ..., $R_{n-1}$ and the inductances of the line segments are denoted by $L_1$, $L_2$, ..., $L_{n-1}$, which are already determined per the above discussion.

As shown in the Izadi paper, the method is able to identify the correct location of the event if only two waveform measurement units (WMUs) are available; as long as the event occurs somewhere between these two WMUs. The method in the Izadi paper is based on certain forward sweep and backward sweep to identify the location of the event. In the forward sweep, the analytics system 108 starts from Sensor 1 at node 1 and calculates the nodal voltages at all the nodes all the way to node n. In the backward sweep, the analytics system 108 starts from Sensor 2 at node n and calculates the nodal voltages at all the nodes all the way to node 1. Suppose the location of the event is at unknown node k. Given the fact that the location of the event is unknown, the analytics system 108 can break down the calculations of the forward and backward sweeps into following correct and incorrect calculations:

$$\underbrace{\{V_1^f, \ldots, V_{k-1}^f, V_k^f}_{correct}, \underbrace{V_{k+1}^b, \ldots, V_n^b\}}_{incorrect} \quad \text{Equation (10)}$$

$$\underbrace{\{V_1^b, \ldots, V_{k-1}^b}_{incorrect}, \underbrace{V_k^b, V_{k+1}^b, \ldots, V_n^b\}}_{correct} \quad \text{Equation (11)}$$

where $V_i^f$ and $V_i^b$ denote the voltages at node i that are calculated from forward and backward sweeps, respectively. In Equations 10 and 11, even though it is not known at which node the event has occurred, it is known that the forward and backward voltage calculations at event node k are correct. In other words, the minimum discrepancy between the forward calculation and backward calculation is at event node k. Therefore, the event is identified as:

$$k^* = \operatorname*{argmin}_i |V_i^f - V_i^b| = \operatorname*{argmin}_i \Psi_i, . \quad \text{Equation (12)}$$

where |.| denotes the operator that takes the magnitude value and $\Psi_i$ denotes the discrepancy index at node i between the results from the forward sweep in Equation 10 and the results from the backward sweep in Equation 11.

So far, this example discusses the case when only two line-mounted sensors are available. In case when multiple sensors are available, the analytics system 108 repeats the same analyses in Equations 10-12 for every two sensors. For example, in the network of FIG. 1, if the event occurs somewhere unknown between Sensor 102(2) and Sensor 102(3), then there are two different sets of discrepancy indexes to examine. One set is obtained by using the waveform measurements from Sensor 102(1) and Sensor 102(3), which we denoted by $\Psi_i^{1,3}$. Another set is obtained by using the waveform measurements from Sensor 102(2) and Sensor 102(4), which we denoted by $\Psi_i^{2,4}$. A combined discrepancy index can be defined as $\Psi_i = \Psi_i^{1,3} + \Psi_i^{2,4}$. Accordingly, the analytics system 108 identifies the location of the event at the minimum of the combined discrepancy index.

Example

Figure 5:
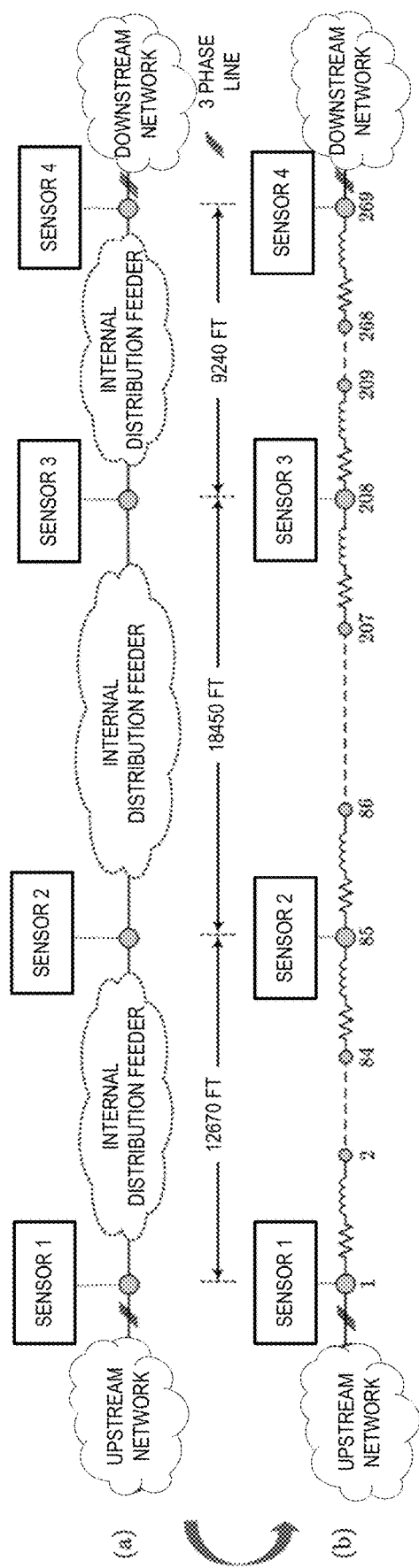
FIG. 5 shows an example feeder used in this example.

In this section, we assess the performance of the proposed data-driven methods and systems discussed herein by applying the method to this feeder. FIG. 5 shows an example feeder used in this example. The feeder has 12 sensors that are installed at four sites (similar to the example shown in FIG. 1). The sensors are labeled based on their sites and their phases as follows: 1A, 1B, 1C, . . . , 4A, 4B, 4C. Each sensor measures e-field and current waveforms whenever an event occurs. The synchronized waveform measurements are collected from all the sensors for 75 events that occurred over a period of six months, from March 2021 till August 2021.

As discussed above, the analytics system 108 does not have any prior knowledge about the structure and parameters of this feeder. The only available information is the latitude and longitude coordinates of the line-mounted sensors. The systems and methods discussed herein can use these coordinates to establish a general architecture of the distribution feeder, as shown in FIG. 5(a). The feeder model is then determinable using the above-discussed principles executed by an analytics system (e.g., analytics system 108) as follows.

Figure 6:
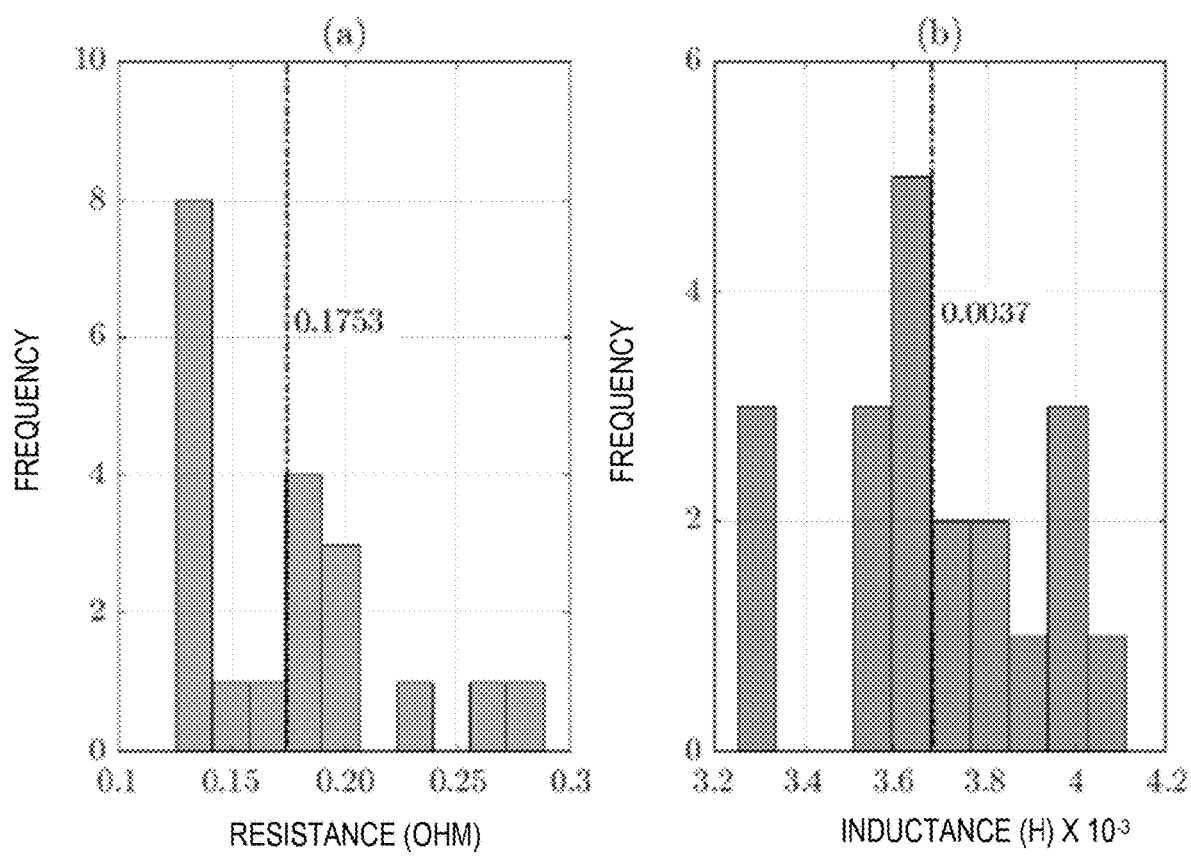
FIG. 6 shows the distribution of the combined resistance and the combined inductance of Phase B of the overhead line between Sensor 1 and Sensor 2 using the proposed methods discussed herein (e.g., generation of network parameters via implementation of block 306 as discussed above).

First, the analytics system uses the synchronized waveform measurements during the 75 captured events to estimate the combined line parameters between every two adjacent sensors. The number of line parameters is 18=2× 3×3. FIG. 6 shows the distribution of the combined resistance and the combined inductance of Phase B of the overhead line between Sensor 1 and Sensor 2 using the proposed methods discussed herein (e.g., generation of network parameters via implementation of block 306 as discussed above). The distribution of the estimated inductance fluctuates over a narrow range, while the estimated resistance varies over a wider range. This is because of the fact that, most of the events that are used to estimate line parameters have resistive characteristics which affect the estimation of the combined resistance. The average resistance and the average inductance over the number of events are marked on the dash lines. Table 1, below, shows the average value of the estimated line parameters of the overhead lines between different sensors in the architecture shown in FIG. 5.

TABLE 1

Results of the Event-based Line Parameter Estimation

| | Phase A | | Phase B | | Phase C | |
|---|---|---|---|---|---|---|
| Sensors | R (Ohm) | L (H) | R (Ohm) | L (H) | R (Ohm) | L (H) |
| 1-2 | 0.1888 | 0.0025 | 0.1753 | 0.0037 | 0.1775 | 0.0032 |
| 2-3 | 0.2443 | 0.0035 | 0.2237 | 0.0029 | 0.2021 | 0.0047 |
| 3-4 | 0.2005 | 0.0017 | 0.3238 | 0.0032 | 0.2047 | 0.0017 |

Once the analytics system estimates the line parameters (e.g., via implementation of block 306 as discussed above), next the analytics system obtains the number of poles/nodes between every two adjacent sensors. The average distance between every two adjacent utility poles in this feeder is 150 ft. From Equation (9), above, the analytics system can obtain the number of poles/nodes between sensors as follows: 85 poles between Sensor 1 and Sensor 2, 124 poles between Sensor 2 and Sensor 3, and 62 poles between Sensor 3 and Sensor 4. Thus, Sensor 1 is at node 1, Sensor 2 is at node 85, Sensor 3 is at node 208=85+124−1, and Sensor 4 is at node 269=208+62−1.

Given the estimated line parameters (e.g., line parameters 130) and the number of line segments (e.g., line segments 132) between every two adjacent sensors, we obtain the resistance (e.g., resistance 140) and the inductance (e.g., inductance 142) of each line segments. FIG. 5(b) shows the proposed reconstructed feeder model (e.g., feeder model 122) of the original unknown feeder. The model has 269 nodes and 268 line segments. This feeder model is an example of feeder model 122 will be later used for the event location identification.

Considering the real-world waveform measurements in FIG. 2, which apply to the example shown in FIG. 5, recall that the event has occurred somewhere on Phase B between Sensor 2 and Sensor 3. Next, the analytics system applies the proposed event location identification method to identify the event node based at least in part on the reconstructed feeder model in FIG. 5(b). Since we do not know which node is the correct event node, we are not able to compute the exact accuracy of the event location identification results. However, if the results are consistent over different cases, we can make sure that the results are correct. In this regard, we apply the proposed event location method to identify the location of the event using two independent sets of data: one set is the waveform data from Sensor 1B and Sensor 3B and the other set is the waveform data from Sensor 2B and Sensor 4B.

Figure 7:
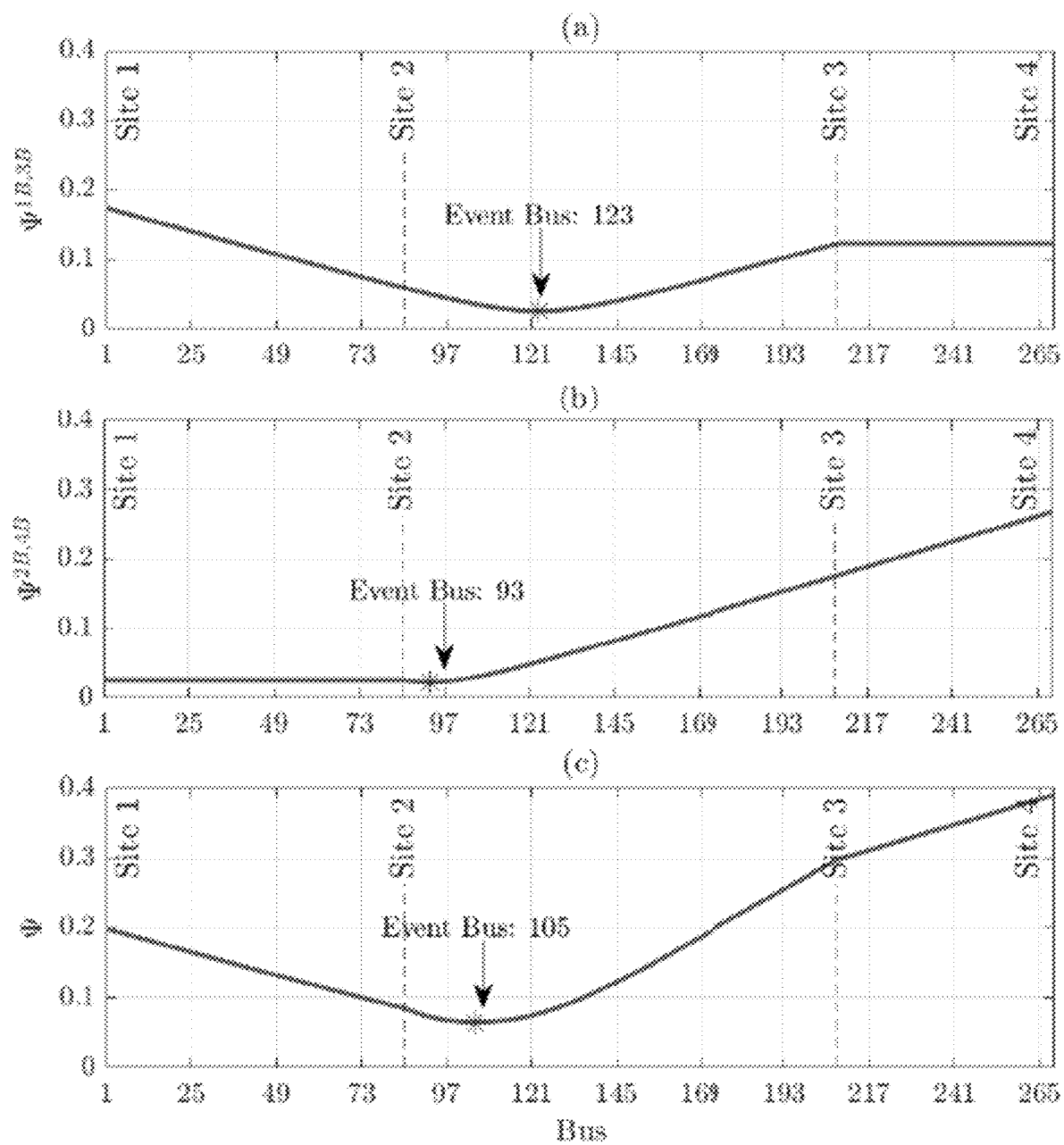
FIG. 7 shows discrepancy index using the waveform measurements from: (a) Sensors 1B and 3B; (b) Sensors 2B and 4B; (c) Sensors 1B, 2B, 3B, 4B.

FIG. 7 shows discrepancy index using the waveform measurements from: (a) Sensors 1B and 3B; (b) Sensors 2B and 4B; (c) Sensors 1B, 2B, 3B, 4B. First, consider the profile of discrepancy index $\Psi_i^{1B,3B}$ for i=1, ..., 269 that is shown in FIG. 7(a). As shown, the minimum value of $\Psi_i^{1B,3B}$ is at node 123. Next, consider the profile of the discrepancy index $\Psi_i^{2B,4B}$ for i=1, ..., 269 that is shown in FIG. 7(b). As shown, the minimum value of $\Psi_i^{2B,4B}$ is at node 95. From the results in FIGS. 7(a) and (b), it is shown that the identified event nodes are always between Sensor 2 and Sensor 3, which is correct. This confirms the accuracy of the proposed event location identification method.

Importantly, the results in FIGS. 7(a) and (b) vary in a narrow range of 29 nodes from node 95 to node 123. Thus, it is expected that the exact location of the event, that we saw its waveforms in FIG. 2, is somewhere between node 95 and node 123. In this case, the identified zone of the event is at the downstream of Sensor 2 and somewhere between 150×(95−85+1)=1650 ft to 150×(123−85+1)=5850 ft. Accordingly, the identified event zone is 5850−1650=4200 ft long, which is less than one mile.

The above results are much more specific than the initial event zone in prior event location systems. Noted that, the initial event zone is somewhere between Sensor 2 and Sensor 3, which is 18450 ft. Thus, the proposed event location identification method is able to significantly narrow down the event zone by 77% from 18450 ft to 4200 ft. This confirms the effectiveness of the proposed method; without using any prior knowledge about the network parameters.

Finally, if sum up the above two discrepancy indexes, the analytics systems and methods discussed herein can obtain the combined discrepancy index $\Psi_i = \Psi_i^{1B,3B} + \Psi_i^{2B,4B}$, that is shown in FIG. 7(c). It is shown that, the minimum value of the combined discrepancy is at node 105, which is inside the identified event zone from node 95 to node 123. This confirms the consistency of the proposed method in identifying the location of the event.

Thus, the present systems and methods provide for an unsupervised event location identification method to identify the location of events using the real-world synchronized e-field and current waveform data; without any prior information about the network. In this method, first, the voltage waveforms are approximated based at least in part on the e-field waveform measurements. Next, the line parameters and number of line segments of the feeder are estimated. These parameters are then used to reconstruct a data-driven feeder model for the original feeder. Finally, the location of the event is identified by using a certain forward and backward voltage calculations. The proposed method was applied to the real-world synchronized waveform measurements from a group of line-mounted sensors on a power distribution feeder. The results illustrated the accuracy, effectiveness, and consistency of the proposed method in identifying the location of events. On average, the proposed method is able to narrow down the event zone by 77%. In certain embodiments, analytics system 108 may send a message (e.g., a notification, alert, etc.) including event location 124 to a device used by a field crew, such that the field crew may address and/or investigate the cause of the event. For example, the message may be delivered to a decision support team who then instructs the field crew. In certain embodiments, analytics system 108 may send the message to SCADA to cause an automatic response to the event, such as shutting down various hardware components associated with the feeder directly upstream from the event location.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for unsupervised power-line event location within a power-line network, comprising:
   receiving e-field measurements from a plurality of line-mounted sensors located on one or more power lines in the power-line network;
   converting the e-field measurements to voltage approximations;
   constructing a feeder model of the power-line network based at least in part on the voltage approximations by at least:
      identifying nodal voltages as changes within voltage waveforms at individual ones of the plurality of line-mounted sensors between a first cycle prior to an event and a second cycle after the event;
      identifying line currents as changes within current waveforms at the individual ones of the plurality of line-mounted sensors between the first cycle and the second cycle; and
      using the nodal voltages and line currents, determining resistance and inductance of individual line segments of the power-line network, the individual line segments being between individual ones of the plurality of line-mounted sensors;
   identifying the event within the power-line network; and
   identifying a location of the event based at least in part on the feeder model.

2. The method of claim 1, further comprising sending a message including the location of the event to an external device.

3. The method of claim 1, wherein the first cycle is one cycle prior to the event, and the second cycle is one cycle after the event.

4. The method of claim 1, further comprising estimating a number of line segments between the individual ones of the plurality of line-mounted sensors based at least in part on average distance between each utility pole in the power-line network.

5. The method of claim 1, further comprising determining a number of line segments between the individual ones of the plurality of line-mounted sensors based at least in part on satellite imagery of the power-line network.

6. The method of claim 1, wherein identifying the event further comprises comparing a current waveform from a first line-mounted sensor of the plurality of line-mounted sensors and a Global Navigation Satellite System (GNSS)-correlated current waveform from a second line-mounted sensor of the plurality of line-mounted sensors downstream from the first line-mounted sensor.

7. The method of claim 1, wherein the e-field measurements are precise time-stamp-synchronized.

8. The method of claim 7, wherein one or more precise time stamps are based at least in part on at least one of: Global Navigation Satellite System (GNSS) signals or Institute of Electrical and Electronics Engineers (IEEE) 1588.

9. The method of claim 1, wherein converting the e-field measurements to the voltage approximations further comprises:
  determining, for individual ones of the plurality of line-mounted sensors, a respective tuning parameter; and
  multiplying individual ones of the e-field measurements by the respective tuning parameter to yield a respective voltage approximation.

10. The method of claim 9, wherein determining the respective tuning parameter further comprises:
  identifying an e-field peak amplitude of an e-field waveform from a respective line-mounted sensor prior to the event;
  identifying a voltage peak amplitude of a voltage waveform corresponding to the respective line-mounted sensor; and
  determining a ratio of the e-field peak amplitude to the voltage peak amplitude.

11. The method of claim 10, wherein identifying the e-field peak amplitude further comprises:
  identifying a time of the event; and
  identifying the e-field peak amplitude of the e-field waveform within a predefined number of cycles prior to the time of the event.

12. The method of claim 11, wherein the predefined number of cycles is ten.

13. The method of claim 1, wherein identifying the location further comprises:
  performing a forward sweep of the power-line network between a first line-mounted sensor of the plurality of line-mounted sensors and a second line-mounted sensor of the plurality of line-mounted sensors downstream from the first line-mounted sensor;
  performing a backward sweep of the power-line network between the first line-mounted sensor and the second line-mounted sensor;
  based at least in part on the forward and backward sweep, determining discrepancy matrix of a plurality of discrepancy index values, individual ones of the plurality of discrepancy index values corresponding to a respective node between the first line-mounted sensor and the second line-mounted sensor; and
  identifying the location as a location corresponding to a minimum discrepancy value within the discrepancy matrix.

14. The method of claim 13, wherein the respective node corresponds to a utility pole location between the first line-mounted sensor and the second line-mounted sensor.

15. A system for unsupervised power-line event location, comprising:
  a processor; and
  a memory storing instructions executable by the processor, wherein when executed the instructions cause the processor to at least:
    receive e-field measurements from a plurality of line-mounted sensors located on one or more power lines in a power-line network;
    convert the e-field measurements to voltage approximations;
    construct a feeder model of the power-line network based at least in part on the voltage approximations by at least:
      identifying nodal voltages as changes within voltage waveforms at individual ones of the plurality of line-mounted sensors between a first cycle prior to an event and a second cycle after the event;
      identifying line currents as changes within current waveforms at the individual ones of the plurality of line-mounted sensors between the first cycle and the second cycle; and
      using the nodal voltages and line currents, determining resistance and inductance of individual line segments of the power-line network, the individual line segments being between individual ones of the plurality of line-mounted sensors;
    identify the event within the power-line network; and
    identify a location of the event based at least in part on the feeder model.

16. The system of claim 15, wherein converting the e-field measurements to the voltage approximations further comprises:
  determining, for individual ones of the plurality of line-mounted sensors, a respective tuning parameter; and
  multiplying individual ones of the e-field measurements by the respective tuning parameter to yield a respective voltage approximation.

17. The system of claim 16, wherein determining the respective tuning parameter further comprises:
  identifying an e-field peak amplitude of an e-field waveform from a respective line-mounted sensor prior to the event;
  identifying a voltage peak amplitude of a voltage waveform corresponding to the respective line-mounted sensor; and
  determining a ratio of the e-field peak amplitude to the voltage peak amplitude.

18. A system for unsupervised power-line event location, comprising:
  a processor; and
  a memory storing instructions executable by the processor, wherein when executed the instructions cause the processor to at least:
    receive e-field measurements from a plurality of line-mounted sensors located on one or more power lines in a power-line network;
    convert the e-field measurements to voltage approximations by at least:
      determining, for individual ones of the plurality of line-mounted sensors, a respective tuning parameter by at least:
        identifying an e-field peak amplitude of an e-field waveform from a respective line-mounted sensor prior to an event;
        identifying a voltage peak amplitude of a voltage waveform corresponding to the respective line-mounted sensor; and
        determining a ratio of the e-field peak amplitude to the voltage peak amplitude; and
      multiplying individual ones of the e-field measurements by the respective tuning parameter to yield a respective voltage approximation;
    construct a feeder model of the power-line network based at least in part on the voltage approximations;

identify the event within the power-line network; and
identify a location of the event based at least in part on the feeder model.

19. The system of claim 18, wherein identifying the location further comprises:
performing a forward sweep of the power-line network between a first line-mounted sensor of the plurality of line-mounted sensors and a second line-mounted sensor of the plurality of line-mounted sensors downstream from the first line-mounted sensor;
performing a backward sweep of the power-line network between the first line-mounted sensor and the second line-mounted sensor;
based at least in part on the forward and backward sweep, determining discrepancy matrix of the plurality of discrepancy index values, individual ones of the plurality of discrepancy index values corresponding to the respective node between the first line-mounted sensor and the second line-mounted sensor; and
identifying the location as a location corresponding to a minimum discrepancy value within the discrepancy matrix.

20. The system of claim 18, wherein the instructions further cause the processor to at least estimate a number of line segments between the individual ones of the plurality of line-mounted sensors based at least in part on average distance between each utility pole in the power-line network.

\* \* \* \* \*